(12) United States Patent
Tawada et al.

(10) Patent No.: US 11,378,628 B2
(45) Date of Patent: Jul. 5, 2022

(54) TESTING DEVICE OF INVERTER DEVICE

(71) Applicant: TOSHIBA MITSUBISHI—ELECTRIC INDUSTRIAL SYSTEMS CORPORATION, Chuo-ku (JP)

(72) Inventors: Yoshihiro Tawada, Tokyo (JP); Tatsuaki Ambo, Tokyo (JP)

(73) Assignee: TOSHIBA MITSUBISHI—ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 17/275,444

(22) PCT Filed: Sep. 2, 2019

(86) PCT No.: PCT/JP2019/034430
§ 371 (c)(1),
(2) Date: Mar. 11, 2021

(87) PCT Pub. No.: WO2021/044485
PCT Pub. Date: Mar. 11, 2021

(65) Prior Publication Data
US 2022/0050144 A1 Feb. 17, 2022

(51) Int. Cl.
*G01R 31/00* (2006.01)
*G01R 31/42* (2006.01)
(Continued)

(52) U.S. Cl.
CPC ............ *G01R 31/42* (2013.01); *G01R 3/00* (2013.01); *G01R 31/006* (2013.01); *G01R 31/50* (2020.01);
(Continued)

(58) Field of Classification Search
CPC ........ G01R 31/42; G01R 31/52; G01R 31/50; G01R 31/54; G01R 31/006; G01R 3/00;
(Continued)

(56) References Cited

U.S. PATENT DOCUMENTS

2011/0215651 A1* 9/2011 Yamada ............... H02M 1/4225
307/75
2014/0184193 A1 7/2014 Waugh et al.
(Continued)

FOREIGN PATENT DOCUMENTS

| JP | 2009-232541 | 10/2009 |
| WO | WO 2015/132960 A1 | 9/2015 |

OTHER PUBLICATIONS

International Search Report dated Oct. 8, 2019 in PCT/JP2019/034430 filed on Sep. 2, 2019.
(Continued)

*Primary Examiner* — Raul J Rios Russo
(74) *Attorney, Agent, or Firm* — Oblon, McClelland, Maier & Neustadt, L.L.P.

(57) ABSTRACT

A testing device of an inverter device includes a power supply device including an AC-DC conversion circuit for converting AC power received from an AC power supply into DC power and a control part for controlling the AC-DC conversion circuit and a filter circuit interposed between a tested inverter device to be tested and the power supply device, having a reactor and a capacitor, and delivering the DC power output from the power supply device to the tested inverter device. The control part is configured to execute output adjustment of the AC-DC conversion circuit when a test start signal is generated to start an instantaneous voltage abnormality test which is a test changing magnitude of power supply voltage of the AC power supply in a predetermined direction being either one of increase or decrease
(Continued)

during operation of the tested inverter device and the power supply device.

4 Claims, 6 Drawing Sheets

(51) Int. Cl.
*G01R 31/52* (2020.01)
*G01R 31/50* (2020.01)
*G01R 31/54* (2020.01)
*G01R 3/00* (2006.01)
*G01R 31/58* (2020.01)
*G01R 31/34* (2020.01)
*G01R 35/00* (2006.01)

(52) U.S. Cl.
CPC ............ *G01R 31/52* (2020.01); *G01R 31/54* (2020.01); *G01R 31/343* (2013.01); *G01R 31/58* (2020.01); *G01R 35/00* (2013.01)

(58) Field of Classification Search
CPC ...... G01R 31/58; G01R 31/343; G01R 35/00; H02M 7/48
USPC .................................................. 324/500–556
See application file for complete search history.

(56) References Cited

U.S. PATENT DOCUMENTS

2016/0329829 A1* 11/2016 Ayai ..................... H02M 7/5387
2018/0375372 A1* 12/2018 Toyoda ..................... H02J 9/06

OTHER PUBLICATIONS

Office Action dated Apr. 12, 2022 in Indian Patent Application No. 202017023003, with concise English translation.

* cited by examiner

F I G. 1
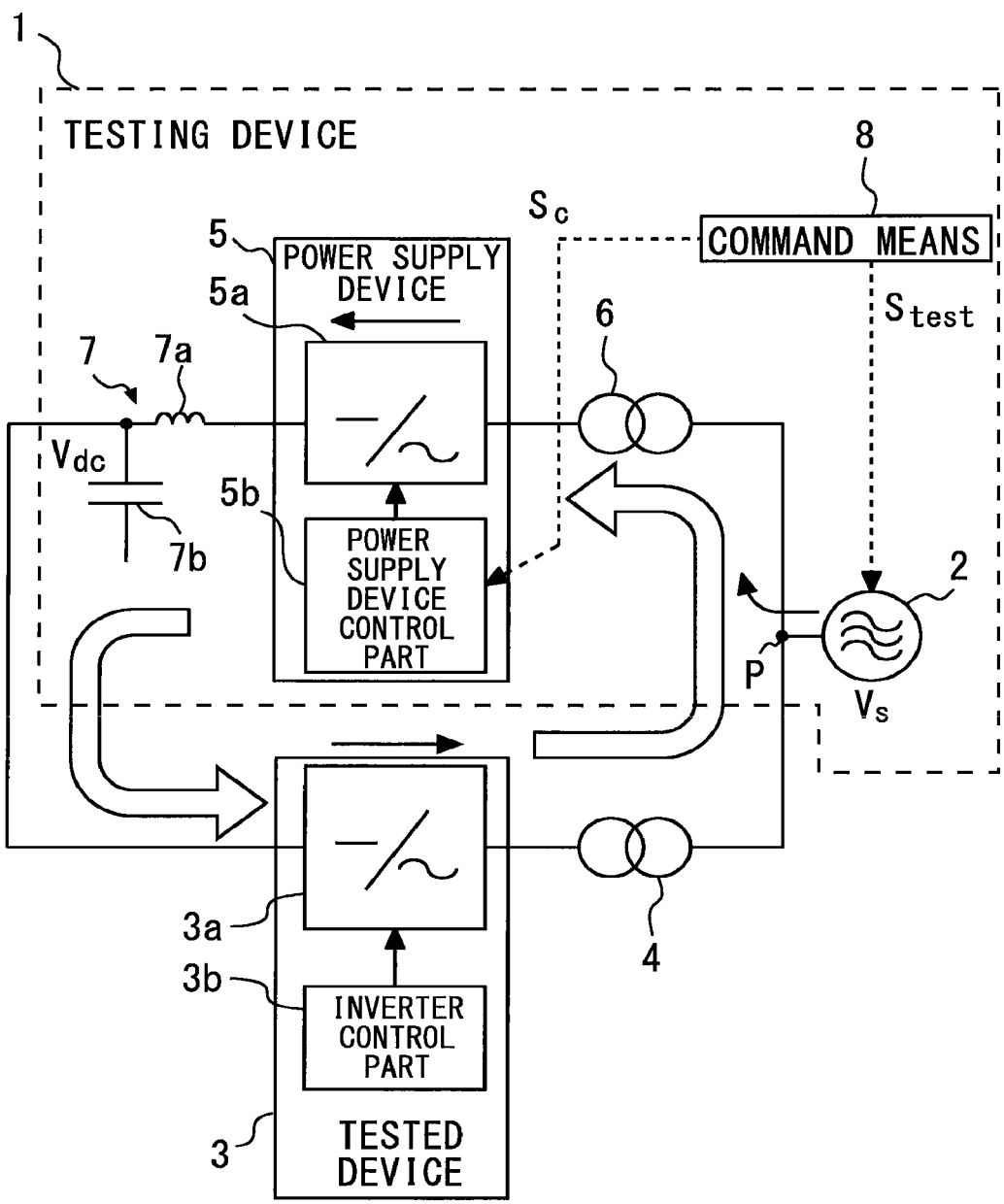

F I G. 2
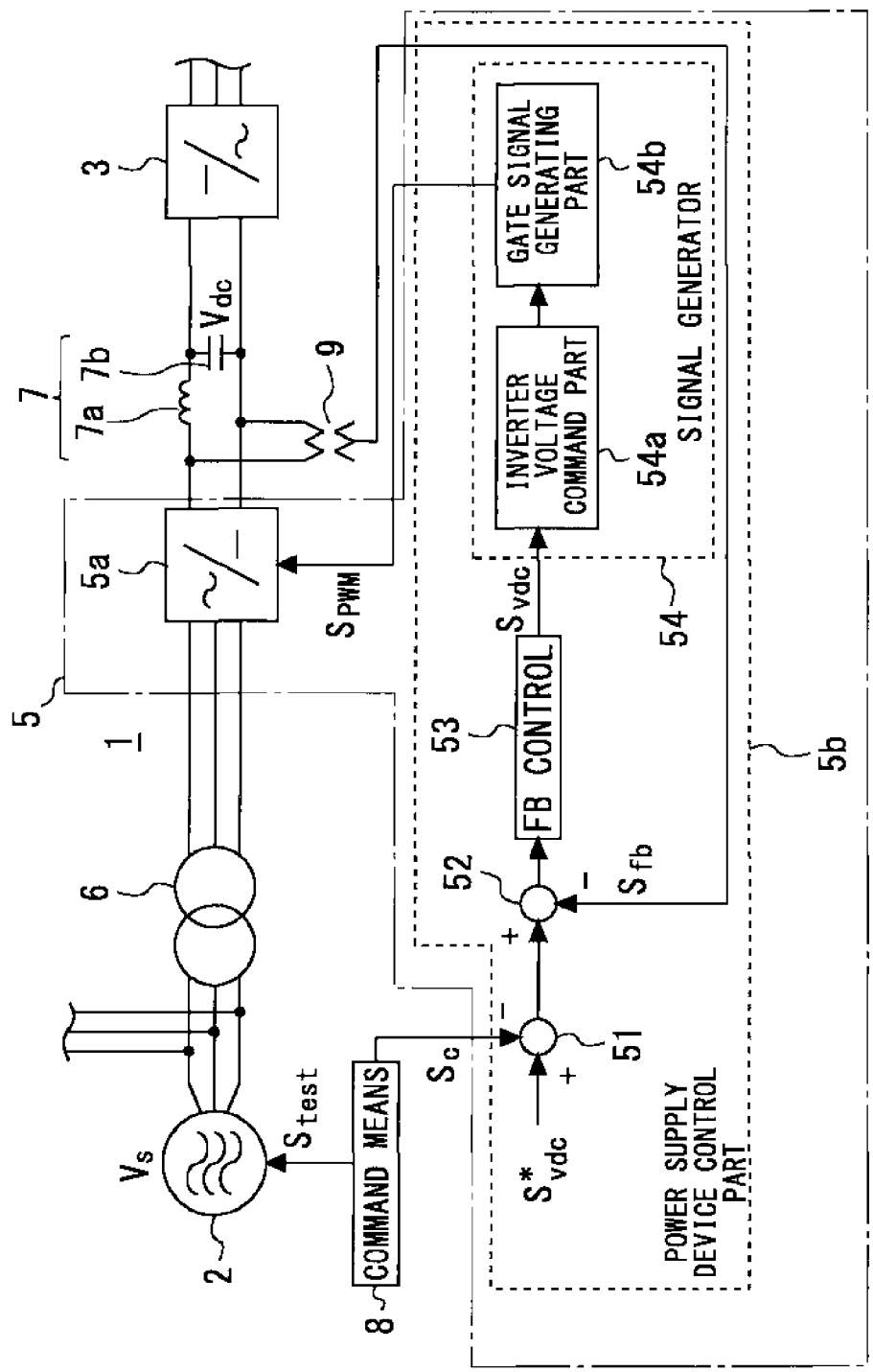

TESTING DEVICE OF INVERTER DEVICE

TECHNICAL FIELD

This application relates to a testing device of an inverter device.

BACKGROUND

Conventionally, as described, for example, in International Publication No. 2015/132960, a testing device for testing an inverter device is known.

CITATION LIST

Patent Literature

[PTL1] International Publication No. 2015/132960

SUMMARY

Technical Problem

One of the test items of the inverter device is an instantaneous voltage abnormality test. More specifically, the instantaneous voltage abnormality test is a test of an operation function which causes an inverter device in a grid connection system to continue operation without being disconnected from an electric power grid even if an "instantaneous voltage change" may occur in the electric power gird.

The testing device of the inverter device may have a system configuration having a power circulation type. The power circulation system includes a power supply device generating DC power supply, a tested inverter device to be tested, and a filter circuit consisting of a reactor and a capacitor, and the power circulation system has a configuration in which the power supply device and the tested inverter device are connected via the filter circuit in a circular manner. The power circulation type system maintains balance between output of the tested inverter device and output of the power supply device, and thereby almost all of electric power can be circulated through the power supply device, the tested inverter device and the filter circuit. This results in that power consumption during a test can be suppressed.

In the configuration of the power circulation type system, the instantaneous voltage abnormality test described above may be conducted. In this case, an AC power supply changes instantaneously its voltage greatly, and the tested inverter device also executes output adjustment in response to this voltage change. At this time, an influence of the instantaneous voltage abnormality affects to control in the power supply device with a time delay, and the power supply device has a delay in control response. The delay in the control response in the power supply device causes a problem that the power circulation may be imbalanced.

The present application has been made to solve the problems as described above, and an object thereof is to provide an improved testing device of an inverter device which is improved to suppress a control imbalance due to a response delay in a test.

Solution to Problem

A testing device of an inverter device according to the present application includes:

a power supply device including an AC-DC conversion circuit for converting AC power received from an AC power supply into DC power and a control part for controlling the AC-DC conversion circuit; and a filter circuit interposed between a tested inverter device to be tested and the power supply device, having a reactor and a capacitor, and delivering the DC power output from the power supply device to the tested inverter device, wherein the control part is configured to execute output adjustment of the AC-DC conversion circuit when a test start signal is generated to start an instantaneous voltage abnormality test which is a test to change magnitude of power supply voltage of the AC power supply in a predetermined direction being either one of increase or decrease during operation of the tested inverter device and the power supply device.

Advantageous Effects

According to the present application, the control part of the power supply device can execute a control correction promptly in response to the test start signal when the test start signal is generated, and this makes it possible to suppress control imbalance due to a response delay in the power supply device at the start of the test.

BRIEF DESCRIPTION OF DRAWINGS

FIG. 1 is a configuration diagram illustrating a testing device of an inverter device according to the embodiment;

FIG. 2 is a configuration diagram for explaining a control part of a power supply device in the testing device of the inverter device according to the embodiment;

DESCRIPTION OF EMBODIMENTS

Figure 3:
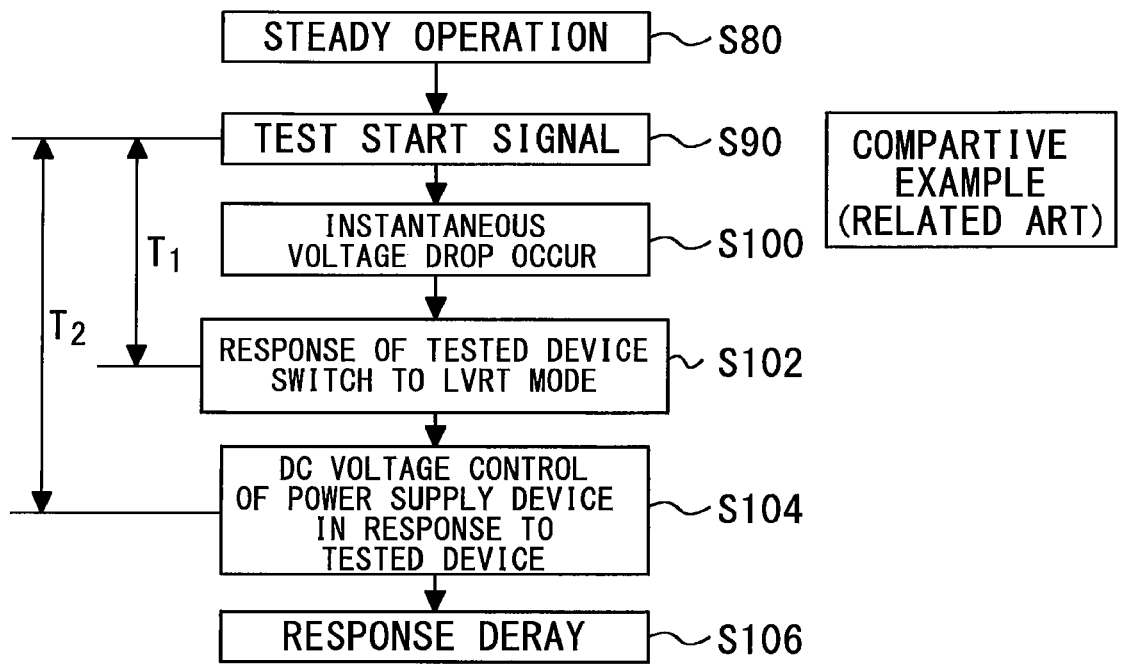
FIG. 3 is a diagram for explaining operation in an instantaneous voltage abnormality test of a testing device according to a comparative example.

FIG. 1 is a configuration diagram illustrating a testing device 1 of an inverter device according to the embodiment. The testing device 1 is a device to test a tested device 3. As shown in FIG. 1, the testing device 1 according to the embodiment includes an AC power supply 2, a power supply device 5, a second transformer 6, a filter circuit 7 consisting of a DC reactor 7a and a DC capacitor 7b, and command means 8.

The testing device 1 according to the embodiment has a power circulation type system configuration. In the testing device 1 having the power circulation type system configuration, the power supply device 5, the tested device 3, and the filter circuit 7 are annularly connected as described below.

The AC power supply 2 generates three-phase AC power. The AC power supply 2 is connected to the power supply device 5 via the second transformer 6. The AC power supply 2 and the second transformer 6 are connected at a connection point, and the connection point is also referred to as a connection point P.

The power supply device 5 includes an AC-DC conversion circuit 5a and a power supply device control part 5b. The AC-DC conversion circuit 5a receives the three-phase AC power from the AC power supply 2 via the second transformer 6, and converts the three-phase AC power into DC power. The AC-DC conversion circuit 5a is a switching converter circuit for converting the three-phase AC power to the DC power by switching operation of a switching element. Since this type of switching converter circuit is a known technique which is also referred to as a "PWM (pulse width modulation) switching converter", the specific description thereof will be omitted. The power supply device control part 5b generates a pulse-width modulated signal $S_{PWM}$ for controlling the AC-DC conversion circuit 5a. Internal configuration of the power supply device control part 5b will be described later with reference to FIG. 2.

The DC capacitor 7b is interposed between the tested device 3 and the power supply device 5. A positive terminal of the DC capacitor 7b is connected to a DC electric wiring which connects a DC input terminal of the tested device 3 and a DC output terminal of the power supply device 5. A negative terminal of the DC capacitor 7b is connected to reference potential, such as ground potential.

DC voltage Vdc of the DC capacitor 7b is determined by output DC voltage outputted from the AC-DC conversion circuit 5a of the power supply device 5. The DC capacitor 7b is charged by the DC output power outputted from the power supply device 5, and the tested device 3 takes in stored power of the DC capacitor 7b as DC input power. Thus, the DC capacitor 7b can supply DC power received from the power supply device 5 to the tested device 3.

The tested device 3 is an inverter device to be tested by the testing device 1 according to the embodiment. The testing device 1 and the tested device 3 are connected via a first transformer 4 at an AC output side of the tested device 3. Specifically, the connection point P in the testing device 1 and an AC output terminal of the tested device 3 (i.e. an output terminal of a switching inverter circuit 3a in the tested device 3) are connected via the first transformer 4.

An AC electrical wiring is provided to connect the AC output terminal of the tested device 3 and an AC input terminal of the power supply device 5, the AC electrical wiring includes the first transformer 4, the connection point P and the second transformer 6 arranged in this order, and the connection point P is connected to the AC power supply 2.

The tested device 3 includes the switching inverter circuit 3a and an inverter control part 3b. The switching inverter circuit 3a converts DC power into AC power by switching operation of a switching element. The inverter control part 3b supplies pulse width modulation signals to the switching inverter circuit 3a. AC power outputted from the AC output terminal of the tested device 3 is transmitted to the AC input terminal of the power supply device 5 via the first transformer 4, the connection point P and the second transformer 6. The tested device 3 is used as a power conversion device for interconnecting with an electric power grid in a gird connection system.

When operation of the testing device 1 is started, electric power is not stored in the DC capacitor 7b. Therefore, first, the power supply device 5 generates DC power by converting the AC power from the AC power supply 2, and charges the DC capacitor 7b with the DC power. Thereafter, each of the power supply device 5 and the tested device 3 performs power conversion, and thereby the output DC power from the power supply device 5 is transmitted to the tested device 3 via the DC capacitor 7b, and the output AC power from the tested device 3 is inputted to the power supply device 5 via the first transformer 4 and the second transformer 6.

Such power circulation system configuration maintains balance between the output of the tested device 3 and the output of the power supply device 5, and this makes it possible to circulate almost all of electric power through the power supply device 5, the tested device 3 and the DC capacitor 7b. In such power circulation process, a slight power conversion loss occurs in each of the power supply device 5 and the tested device 3. Since the AC power supply 2 is only to compensate for shortage power reduced by the power conversion loss, power consumption during the test is suppressed.

Inverter device test items according to the embodiment include an "instantaneous voltage abnormality test". More specifically, the instantaneous voltage abnormality test is a test of an operation function which causes an inverter device in a grid connection system to continue operation without being disconnected from an electric power grid even if an "instantaneous voltage change" may occur in the electric power grid.

The instantaneous voltage anomaly test includes at least one of a LVRT test and a HVRT test. The LVRT (Low Voltage Ride-Through) is a function to continue operation without being disconnected from an electric power grid even if an "instantaneous voltage drop" occurs in the grid. The HVRT (High Voltage Ride-Through) is a function to continue operation without being disconnected from an electric power gird even if an "instantaneous voltage rise" occurs in the grid. The tested device 3 includes each of a LVRT mode and a HVRT mode.

The instantaneous voltage abnormality test changes magnitude of power supply voltage Vs of the AC power supply 2 in a "predetermined direction" being either one of increase or decrease during operation of the tested device 3 and the power supply device 5. That is, the LVRT test is conducted in such a manner that the magnitude of the power supply voltage Vs of the AC power supply 2 is changed in a decreasing direction during operation of the tested device 3 and the power supply device 5, and therefore the predetermined direction described above is a decreasing direction. The HVRT test is conducted in such a manner that the magnitude of the power supply voltage Vs of the AC power supply 2 is changed in an increasing direction during operation of the tested device 3 and the power supply device 5, and therefore the predetermined direction described above is an increasing direction. The power supply device control part 5b executes output adjustment in accordance with an output mode of the tested device 3 when a test start signal $S_{test}$ for starting the instantaneous voltage abnormality test is generated.

Specific contents of this output adjustment is set in advance fixedly or selectably, in relation to the "predetermined direction" which is a direction for changing the power supply voltage in the instantaneous voltage abnormality test, in correspondence with the output mode of the tested device 3. More particularly, output adjustment according to a first example may be set in advance so as to cause the AC-DC conversion circuit 5a to change an output thereof in the same direction as the predetermined direction. An output adjustment according to a second example may be set in advance so as to cause the AC-DC conversion circuit 5a to change the output thereof in a direction opposite to the predetermined direction. Alternatively, an output adjustment according to a third example may be configured in advance in a form of a selectable logic which can selectively choose one output adjustment between an output change of the AC-DC conversion circuit 5a in the same direction as the predetermined direction and an output change of the AC-DC conversion circuit 5a in the opposite direction to the predetermined direction. In the embodiment, the first example, the second example and the third example may be referred together to as "output adjustment in a direction set in advance in relation to the predetermined direction".

The command means 8 is connected to the AC power supply 2 and the power supply device control part 5b. The command means 8 is configured to transmit the test start signal $S_{test}$ to the AC power supply 2. The command means 8 is configured to transmit a correction value Sc for correction control to the power supply device control part 5b. The command means 8 is configured to transmit the correction value Sc and the test start signal $S_{test}$ at the same time.

The command means 8 has a hardware configuration configured to be able to transmit the signals to the AC power supply 2 and the power supply device control part 5b. For example, the command means 8 may be provided as one hardware of a signal generating circuit for generating each of the above signals. Alternatively, the command means 8 may be hardware or software which is additionally installed in either one of a control circuit (not shown) of the AC power supply 2 and the power supply device control part 5b. Alternatively, the command means 8 may be provided by implementing software of a signal generation program for each signal described above in an external control terminal or the like which can be operated by a test operator.

FIG. 2 is a configuration diagram for explaining the power supply device control part 5b of the power supply device 5 in the testing device 1 of the inverter device according to the embodiment. The testing device 1 further includes a voltmeter 9 provided at an output terminal of the AC-DC converter 5a. The power supply device control part 5b includes a correction part 51, an arithmetic part 52, a feedback control part 53, and a signal converter 54.

The power supply device control part 5b is configured to control the DC voltage outputted from the AC-DC conversion circuit 5a in accordance with a control command value $S^*_{Vdc}$. The control command value $S^*_{Vdc}$ includes a target voltage command value of the DC output voltage outputted from the AC-DC conversion circuit 5a. The DC voltage Vdc of the DC capacitor 7b depends on a value of the control command value $S^*_{Vdc}$.

The arithmetic part 52 is a subtraction block for calculating difference between a measured value by the voltmeter 9 and the target voltage command value. The feedback control part 53 is configured to adjust an input signal $S_{Vdc}$ transmitted into the signal converter 54 so as to close to zero the difference calculated by the arithmetic part 52. The feedback control part 53 can be configured by, for example, a known feedback control part such as a PI control part or PID control part.

The signal converter 54 is configured to generate the pulse width modulation signal $S_{PWM}$ based on the input signal $S_{Vdc}$ transmitted from the feedback control part 53. The pulse width modulation signal $S_{PWM}$ is a switching control signal for turning on and off the switching element such as an IGBT and the like provided in the AC-DC conversion circuit 5a.

Specifically, the signal converter 54 includes an inverter voltage command part 54a and a gate signal generating part 54b. The inverter voltage command part 54a calculates an inverter voltage command value based on the input signal $S_{Vdc}$ from the feedback control part 53. The gate signal generating part 54b is configured to generate the pulse width modulation signal $S_{PWM}$ as a gate driving signal of the switching element in accordance with the inverter voltage command value.

The feed-back control in the above configuration implements DC voltage constant control for controlling the DC voltage Vdc of the DC capacitor 7b within a desired fixed value.

The correction part 51 according to the embodiment corrects the control command value $S^*_{Vdc}$ so as to execute the output adjustment of the AC-DC conversion circuit 5a in the same direction as the "predetermined direction" described above when the test start signal $S_{test}$ is generated. The correction part 51 is a subtraction block provided in a front stage of the arithmetic part 52. The correction part 51 outputs a corrected target voltage command value obtained by including the correction value Sc having a predetermined magnitude into the target voltage command value. The correction part 51 is configured to transmit this corrected target voltage command value to the arithmetic part 52.

Figure 4:
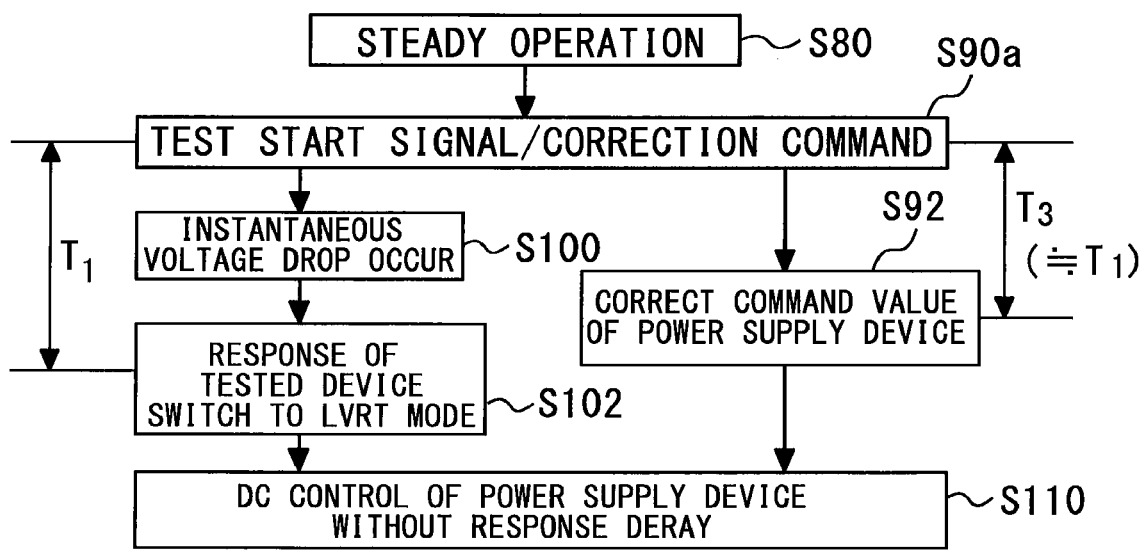
FIG. 4 is a diagram for explaining operation in an instantaneous voltage abnormality test of the testing device of the inverter device according to the embodiment.
Figure 5:
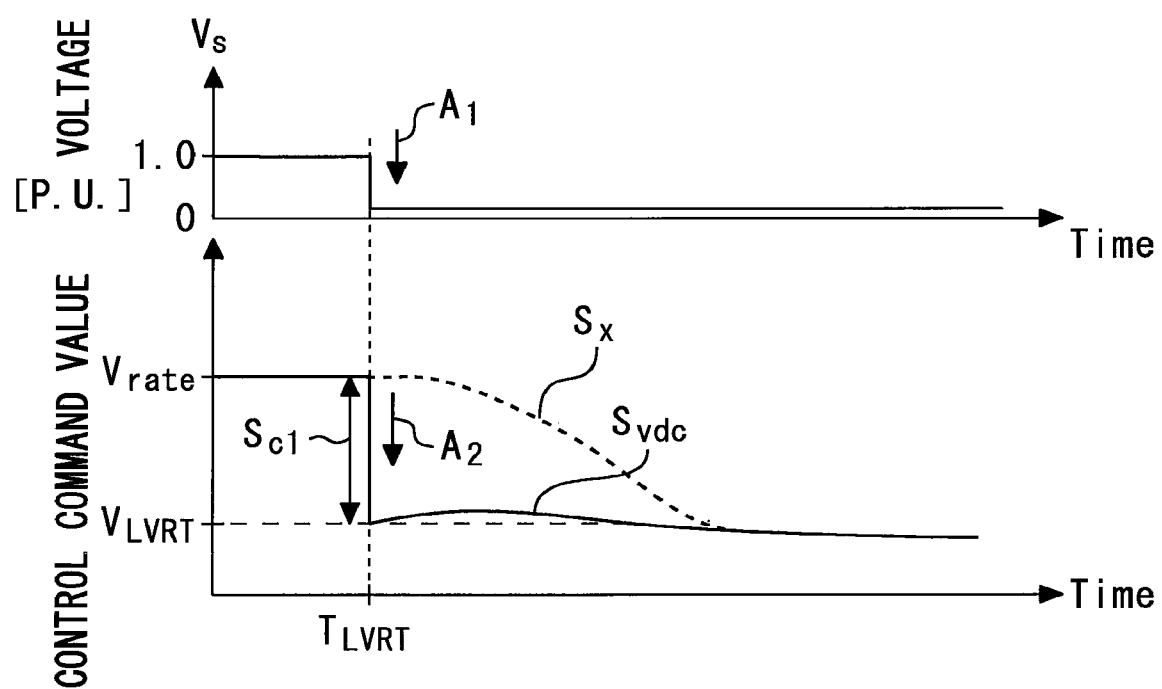
FIG. 5 is a graph for explaining the operation in the instantaneous voltage abnormality test of the testing device of the inverter device according to the embodiment.

Referring to FIGS. 3 to 5, explanation will now be given about operation in which the testing device 1 of the inverter device according to the embodiment performs upon the instantaneous voltage abnormality test. For convenience of the explanation, the instantaneous voltage abnormality test is assumed to be the instantaneous voltage drop test (in other words, a LVRT test) which instantaneously decreases the power supply voltage.

FIG. 3 is a diagram for explaining the operation in the instantaneous voltage abnormality test of the testing device 1 according to a comparative example. At steady state, power is circulated between the testing device 1 and the tested device 3 in a well-balanced state (step S80). Thereafter, the test start signal $S_{test}$ is generated for starting the instantaneous voltage abnormality test (step S90). An instantaneous voltage drop (instantaneous low voltage) occurs in the AC power supply 2 in response thereto (step S100).

When voltage of the AC power supply 2 is greatly dropped instantaneously in step S100, the tested device 3 also executes the output adjustment in response to the voltage change (step S102). More specifically, the output adjustment of the tested device 3 is that the tested device 3 operates in a predetermined LVRT mode. In FIG. 3, it is assumed that a first time period T1 takes from step S90 to the step S102.

When the tested device 3 adjusts the output thereof in step S102, the tested device 3 changes an amount of power taken from the DC capacitor 7b. As described above, the power supply device 5 executes feedback control based on DC voltages of the DC capacitor 7b. In response to a voltage change in the DC capacitor 7b after the start of the instantaneous voltage abnormal test, the power supply device 5 adjusts charging voltage applied to the DC capacitor 7b (step S104). In FIG. 3 it is assumed that a second time period T2 takes from step S90 to the step S104.

Since there is transition of a state in the order of the instantaneous voltage drop (step S100)→a response by the tested device 3 (step S102)→a response by the power supply device 5 (step S104) as described above, a response delay occurs in the power supply device 5 (step S106). Difference between the first time period T1 and the second time period T2 corresponds to this response delay. Occurrence of such a transient response delay in the power supply device 5 causes a problem that imbalance occurs in power circulation balance having been kept to the stage of step S80. The imbalance in the power circulation balance may cause DC overvoltage or output fluctuation.

FIG. 4 is a diagram for explaining the operation in the instantaneous voltage abnormality test of the testing device 1 of the inverter device according to the embodiment. Differences between FIG. 4 and FIG. 3 is that step S90 is replaced with step S90a, step S92 is inserted, step S104 is omitted, and step S106 is replaced with the step S110.

In the embodiment, step S90a causes the command means 8 to output the correction value Sc and the test start signal $S_{test}$ at the same time. In FIGS. 3 and 4, it is common that each of step S100 and step S102 is executed in accordance with the test start signal $S_{test}$.

However, in FIG. 4, the correction value Sc is transmitted to the power supply device control part 5b, and thereby the control command value $S^*_{Vdc}$ for the power supply device 5 is corrected (step S92). A time period from step S90a to step S92 is a third time period T3. Time difference between the first time period T1 and the third time period T3 is shorter than the time difference between the first time period T1 and the second time period T2. Actually, control timings in the command means 8, the power supply device 5 and the tested device 3 are configured so that the third time period T3 and the first time period T1 are equal or substantially equal to each other.

In the embodiment illustrated in FIG. 4, the power supply device 5 can properly execute the DC voltage constant control without causing the response delay which has been a problem in step S106 in the comparative example of FIG. 3 (step S110). This makes it possible to suppress the transient response delay in the power supply device 5, and the transient response output of the power supply device 5 can follow without delay to the transient response output on a side of the tested device 3. As a result, it is possible to perform the instantaneous voltage abnormality test while preventing the power circulation balance in step S80 from being imbalanced.

FIG. 5 is a graph for explaining the operation in the instantaneous voltage abnormality test of the testing device 1 of the inverter device according to the embodiment. The graph in FIG. 5 corresponds to operation according to the embodiment in FIG. 4. In FIG. 5, the instantaneous voltage drop abnormal test (in other words, the LVRT test) is illustrated as the instantaneous voltage abnormal test.

The AC power supply 2 changes magnitude of the power supply voltage Vs in a decreasing direction A1 at time $T_{LVRT}$ in response to the test start signal $S_{test}$ from the command means 8. An amount of power supply voltage change in the decreasing direction A1 is a predetermined decrease amount. As an example, the power supply voltage Vs may be reduced to near 0%, or the power supply voltage Vs may be reduced to about 10%, 20% or 30%, when the power supply voltage Vs before the start of the test is 100%, for example.

The power supply device control part 5b executes correction control so as to change the control command value $S^*_{Vdc}$ in a decreasing direction A2 at the time $T_{LVRT}$ in response to transmission of the correction value Sc from the command means 8. Magnitude of a correction value Sc1 in FIG. 5 is difference between a voltage command value $V_{rate}$ during a steady state operation and a predetermined corrected control target voltage $V_{LVRT}$. Each magnitude of the corrected control target voltage $V_{LVRT}$ and the correction value Sc1 is set in advance based on test contents such as an instantaneous voltage drop amount of the AC power supply 2. Incidentally, when the LVRT test has several variations in the decrease amount in the power supply voltage Vs, a modification may be provided in such a manner that the corrected control target voltage $V_{LVRT}$ and the correction value Sc1 may change in proportion to the decrease amount in the power supply voltage Vs.

FIG. 5 illustrates a control command value Sx according to a comparative example by a broken line, which is in a case of not applying the embodiment. Comparing the control command value Sx in the comparative example and the control command value $S^*_{Vdc}$ in the embodiment, it is recognized that a transient response is improved in the embodiment.

Next, explanation will now be given about operation in an instantaneous voltage abnormality test of the testing device 1 of the inverter device according to a modification of the embodiment. In this modification, an instantaneous voltage increase abnormality test (in other words, HVRT test) will be explained as the instantaneous voltage abnormality test.

A change direction of the AC power supply 2 in the HVRT test according to a modification is opposite to that in the LVRT test in FIG. 5. The AC power supply 2 may change magnitude of the power supply voltage Vs in an increasing direction at specific time in response to the test start signal from the command means 8. An amount of the power supply voltage change in the increasing direction is a predetermined increase amount. As an example, the power supply voltage Vs may be increased to around 130% or 140%, when the power supply voltage Vs before the start of the test is 100%, for example.

The power supply device control part 5b may perform correction control so as to change the control command value $S^*_{Vdc}$ in the increasing direction at specific time in response to transmission of the correction value Sc from the command means 8. Magnitude of the correction value in this case is a difference value between the voltage command value $V_{rate}$ during the steady state operation and a predetermined corrected control target voltage. Each magnitude of the corrected control target voltage and the correction value is set in advance based on test contents such as an amount of instantaneous voltage increase of the AC power supply 2. Incidentally, when the HVRT test has some variations in the increase amount of the power supply voltage Vs, a modification may be provided in such a manner that the corrected control target voltage and the correction value may change in proportion to the increase amount of the power supply voltage Vs.

Incidentally, explanation of operation in FIGS. 3 and 4 are assumed to include the LVRT test illustrated in FIG. 5. However, the HVRT test and the LVRT test have similar test contents except that the change directions of the AC power supplies 2 are opposite to each other. Therefore, the explanation of the operation in FIGS. 3 and 4 may be applied similarly to the HVRT test according to the modification by replacing the "LVRT" to the "HVRT" and replacing the "instantaneous voltage drop" to the "instantaneous voltage increase" in each step in FIGS. 3 and 4.

Figure 6:
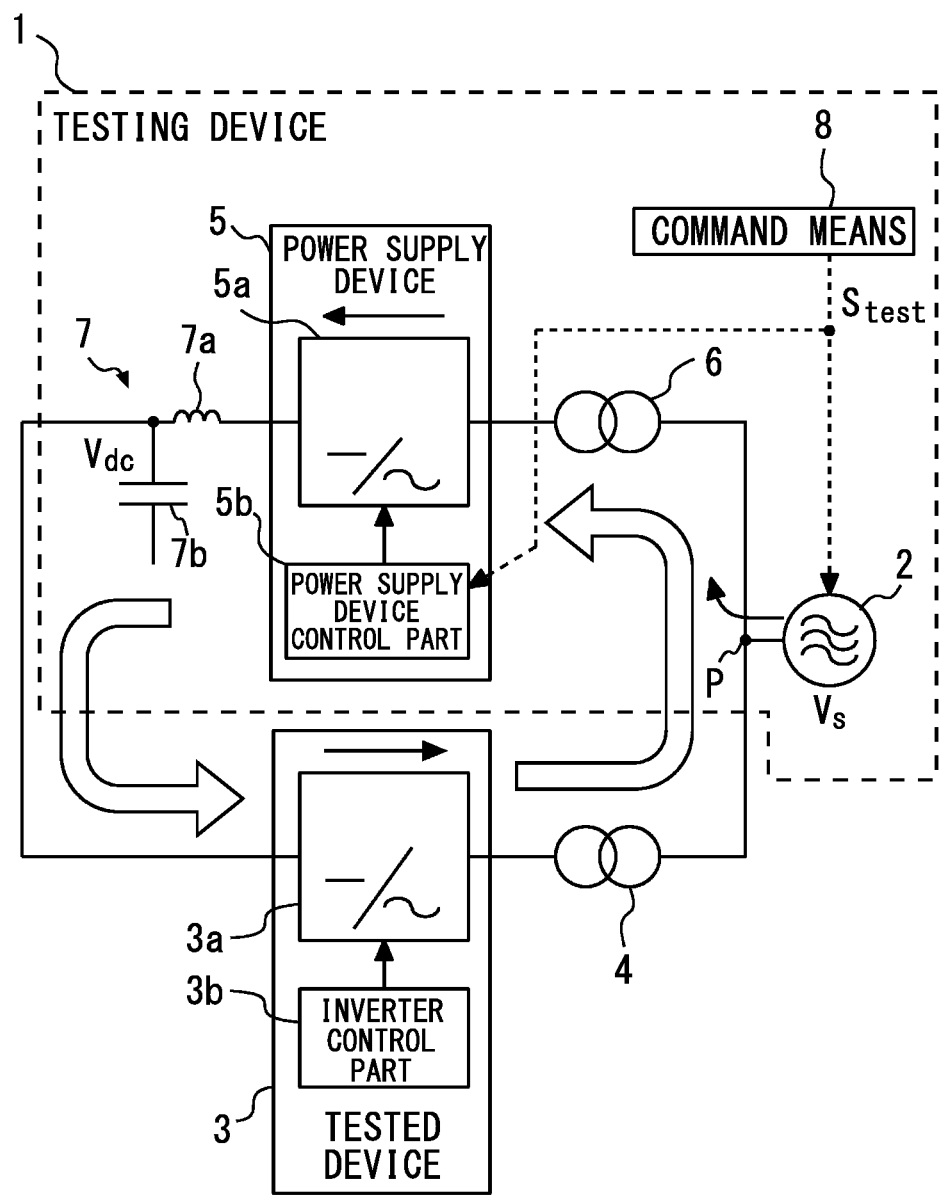
FIG. 6 is a configuration diagram illustrating a testing device of the inverter device according to a modification of the embodiment.
Figure 7:
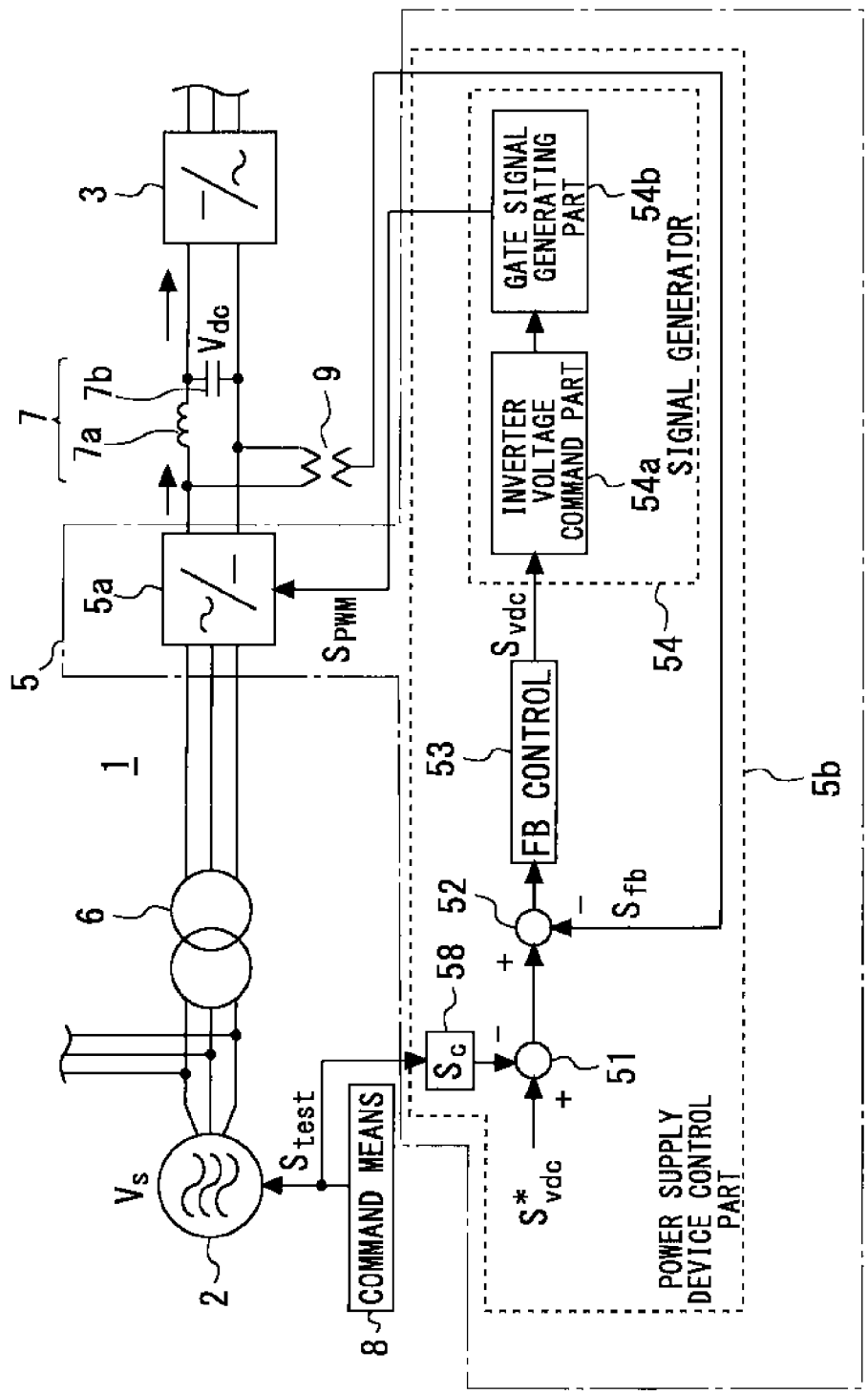
FIG. 7 is a configuration diagram for explaining a control part of the power supply device in a testing device of the inverter device according to a modification of the embodiment.

FIG. 6 is a configuration diagram illustrating the testing device 1 of the inverter device according to a modification of the embodiment. FIG. 7 is a configuration diagram for explaining the power supply device control part 5b of the power supply device 5 in the testing device 1 of the inverter device according to the modification of the embodiment. The configuration in FIGS. 1 and 2 and the configuration in FIGS. 6 and 7 are different in that the command means 8 does not output the correction value Sc, and the power supply device control part 5*b* includes a correction value output part 58.

In the modification in FIGS. 6 and 7, the command means 8 transmits the test start signal $S_{test}$ to the AC power supply 2 and the power supply device control part 5*b*. The power supply device control part 5*b* has inside thereof the correction value output part 58 for outputting the correction value Sc in response to the test start signal $S_{test}$. As in this modification, the power supply device control part 5*b* may be configured to start correction control in response to an input of the test start signal Stest rather than an input of the correction value Sc.

In the embodiment, the correction part 51 is provided in front of the arithmetic part 52, and thereby the correction value Sc is included into the control command value $S^*_{Vdc}$. However, since the correction control in the power supply device control part 5*b* is for reducing the output DC voltage from the AC-DC conversion circuit 5*a* by a predetermined decrease amount, it is sufficient that results of the correction control is included in the pulse width modulation signal $S_{PWM}$ transmitted to the AC-DC conversion circuit 5*a*.

Modifications may be provided in such a manner that a correction part for executing the correction control may be provided at any one of a position between the arithmetic part 52 and the feedback control part 53, a position between the feedback control part 53 and the inverter voltage command part 54*a*, a position between the inverter voltage command part 54*a* and the gate signal generating part 54*b*, and a position between the gate signal generating part 54*b* and the AC-DC conversion circuit 5*a*. The correction part may calculate a correction value having a form adapted to each signal in each of the above positions so as to execute output adjustment in the AC-DC conversion circuit 5*a* in the same direction as a voltage change direction in the instantaneous voltage abnormal test.

According to the embodiment described above, since the power supply device control part 5*b* in the power supply device 5 can execute the correction control in response to the test start signal $S_{test}$ when the test start signal $S_{test}$ is generated, it is possible to suppress imbalance in control balance due to the response delay in the power supply device 5 during tests.

REFERENCE SIGNS LIST

1 Testing device
2 AC power supply
3 Tested device
3*a* Switching inverter circuit
3*b* Inverter control part
4 First transformer
5 Power supply device
5*a* AC-DC conversion circuit
5*b* power supply device control part
6 Second transformer
7 Filter circuit
7*a* DC reactor
7 *b* DC capacitor
8 Command means
9 Voltmeter
51 Correction part
52 Arithmetic part
53 Feedback control part
54 Signal converter
54*a* Inverter voltage command part
54*b* Gate signal generating part
58 Correction value output part
A1, A2 Decreasing direction
B1, B2 Increase direction
$S^*_{Vdc}$ Control command value
Sc, Sc1, Sc2 Correction value
$S_{PWM}$ Pulse width modulation signal
$S_{test}$ Test start signal
$S_{Vdc}$ Input signal
Sx Control command value in comparative example
Vdc DC voltage
Vs Power supply voltage

The invention claimed is:

1. A testing device of an inverter device comprising:
   a power supply device including an AC-DC conversion circuit for converting AC power received from an AC power supply into DC power and a control part for controlling the AC-DC conversion circuit; and
   a filter circuit interposed between a tested inverter device to be tested and the power supply device, having a reactor and a capacitor, and delivering the DC power output from the power supply device to the tested inverter device,
   wherein the control part is configured to execute output adjustment of the AC-DC conversion circuit when a test start signal is generated to start an instantaneous voltage abnormality test which is a test to change magnitude of power supply voltage of the AC power supply in a predetermined direction being either one of increase or decrease during operation of the tested inverter device and the power supply device.

2. The testing device of the inverter device according to claim 1,
   wherein the control part is configured to control DC voltage outputted from the AC-DC conversion circuit in accordance with a control command value, and
   wherein the control part includes a correction part for correcting the control command value so as to execute output adjustment in the AC-DC conversion circuit in a direction which in set in advance in relation to the predetermined direction when the test start signal is generated.

3. The testing device of the inverter device according to claim 2, further comprising a voltmeter provided at an output end of the AC-DC conversion circuit,
   wherein the AC-DC conversion circuit is a switching converter circuit for converting AC power into DC power by switching operation of a switching element,
   wherein the control command value includes a target voltage command value of DC output voltage outputted from the AC-DC conversion circuit, and
   wherein the control part includes
      a signal converter configured to generate a switching control signal for controlling on-off of the switching element based on an input signal,
      an arithmetic part for calculating difference between a measured value measured by the voltmeter and the target voltage command value, and
      a feedback control part configured to adjust the input signal inputted to the signal converter so as to bring the difference calculated by the arithmetic part close to zero.

4. The testing device of the inverter device according to claim 3,
   wherein the correction part is provided in front of the arithmetic part, and
   wherein the correction part is configured to transmit to the arithmetic part a corrected target voltage command value calculated by including a correction value having predetermined magnitude into the target voltage command value.

\* \* \* \* \*